United States Patent
Park et al.

(10) Patent No.: US 9,788,383 B2
(45) Date of Patent: Oct. 10, 2017

(54) LIGHTING APPARATUS (71) Applicant: LG INNOTEK CO., LTD., Seoul (KR)

(72) Inventors: Gwui Youn Park, Seoul (KR); Myeong Jeong Kim, Seoul (KR); Soo Min Lee, Seoul (KR); Yu Won Lee, Seoul (KR)

(73) Assignee: LG INNOTEK CO., LTD., Seoul (KR)

( * ) Notice: Subject to any disclaimer, the term of this patent is extended or adjusted under 35 U.S.C. 154(b) by 0 days.

(21) Appl. No.: 14/981,283

(22) Filed: Dec. 28, 2015

(65) Prior Publication Data

US 2016/0192453 A1 Jun. 30, 2016

(30) Foreign Application Priority Data

Dec. 29, 2014 (KR) .................. 10-2014-0192481

(51) Int. Cl.
*H05B 33/08* (2006.01)
*H01L 33/50* (2010.01)
*H01L 33/56* (2010.01)

(52) U.S. Cl.
CPC ....... *H05B 33/0857* (2013.01); *H01L 33/504* (2013.01); *H01L 33/56* (2013.01); *H05B 33/0809* (2013.01)

(58) Field of Classification Search
CPC ............ H05B 33/0815; H05B 33/0818; H05B 33/0884; H05B 33/0809; H05B 33/0848; H05B 33/0857; H05B 37/029
USPC .................................. 315/294, 291, 224, 307
See application file for complete search history.

(56) References Cited

U.S. PATENT DOCUMENTS

| 7,918,581 B2 | 4/2011 | Van De Ven et al. |
| 2010/0219770 A1 | 9/2010 | Kim et al. |
| 2011/0148327 A1* | 6/2011 | Van de Ven ....... H05B 33/0863 315/312 |
| 2011/0193105 A1* | 8/2011 | Lerman ............... H01L 25/0753 257/88 |
| 2013/0002167 A1* | 1/2013 | Van de Ven ....... H05B 33/0815 315/297 |
| 2014/0049172 A1* | 2/2014 | Bakk .................. H05B 33/0863 315/192 |
| 2014/0167653 A1* | 6/2014 | Chobot ................ H05B 37/029 315/362 |
| 2014/0228914 A1* | 8/2014 | van de Ven .......... A61N 5/0618 607/88 |
| 2014/0319560 A1* | 10/2014 | Tischler .................. H01L 29/00 257/98 |

(Continued)

FOREIGN PATENT DOCUMENTS

EP 1 462 711 A1 9/2004

*Primary Examiner* — Douglas W Owens
*Assistant Examiner* — Syed M Kaiser
(74) *Attorney, Agent, or Firm* — Birch, Stewart, Kolasch & Birch, LLP (57) ABSTRACT

Embodiments provide a lighting apparatus including a light source unit including a first light source and a second light source, a light source driving unit including a first driver configured to supply first supply current to the first light source and a second driver configured to supply second supply current to the second light source, and a controller configured to control the first driver so as to vary the level of the first supply current and to control the second driver so as to fix the level of the second supply current.

12 Claims, 8 Drawing Sheets

(56) References Cited

U.S. PATENT DOCUMENTS

2015/0054417 A1\* 2/2015 Lee .................... H05B 37/0272
　　　　　　　　　　　　　　　　　　　　315/201

\* cited by examiner

LIGHTING APPARATUS

CROSS REFERENCE TO RELATED APPLICATION

This application claims priority under 35 U.S.C. §119 to Korean Patent Application No. 10-2014-0192481 filed in Korea on 29 Dec. 2014 which is hereby incorporated in its entirety by reference as if fully set forth herein.

TECHNICAL FIELD

Embodiments relate to a lighting apparatus.

BACKGROUND

In general, color reproducibility is measured using a color rendering index (CRI). The CRI of sunlight is about 100, the CRI of an incandescent lamp is about 95, and the CRI of a fluorescent lamp is about 70 to 80. A light emitting diode is a semiconductor device having well-known light emitting properties. Such a light emitting diode excites electrons across a band gap between a valence band and a conductive band of a semiconductor active layer and thus emits light. Here, light of a wavelength band depending on the band gap may be emitted. That is, color of light emitted from the light emitting diode depends on a semiconductor material of the active layer of the light emitting diode.

For example, an emission spectrum of the light emitting diode is generally concentrated only on one wavelength band. This is suitable for some applications but is not suitable for other applications, for example, the case in that the emission spectrum emits light providing a very low CRI.

Since white light requires mixing of at least two colored lights, only one light emitting diode may not produce white light. As one example, when three light emitting diodes emitting red, blue and green lights are used, white light may be produced. As another example, if one light emitting diode emitting blue light is provided and a luminescent material, such as a phosphor, emits yellow light in response to excitation of light emitted from the blue light emitting diode, white light may be produced by mixing blue light and yellow light. Such a luminescent material may be present in an encapsulating member to encapsulate the light emitting diode.

In general, a 1976 CIE chromaticity diagram is a useful index to define colors through weighted sums of colors. Recently, demand for lighting apparatuses including light emitting diodes, i.e., solid state light emitting units having higher energy efficiency, an enhanced CRI, enhanced efficiency (lm/W), and a longer lifespan, has increased. However, when a light source is manufactured, the CRI of the light source is fixed and thus may not be tuned.

SUMMARY

Embodiments provide a lighting apparatus having light properties in which at least one of a general color rendering index (CRI: Ra) or a correlated color temperature (CCT) may be tuned.

In one embodiment, a lighting apparatus includes a light source unit including a first light source and a second light source, a light source driving unit including a first driver configured to supply first supply current to the first light source and a second driver configured to supply second supply current to the second light source, and a controller configured to control the first driver so as to vary the level of the first supply current and to control the second driver so as to fix the level of the second supply current. At least one of the first or second light source may emit light of a UV wavelength band.

The first light source may include a first light emitting device and a first wavelength conversion unit configured to convert the wavelength of light emitted from the first light emitting device, and the second light source may include a second light emitting device and a second wavelength conversion unit configured to convert the wavelength of light emitted from the second light emitting device.

The first light emitting device may emit light of a UV wavelength band and the second light emitting device may emit light of a blue wavelength band.

The light source unit may consist of the first and second light sources and the light source driving unit may consist of the first and second drivers.

The first wavelength conversion unit may include a blue fluorescent material and a first encapsulating member configured to encapsulate the first light emitting device and the blue fluorescent material, and the second wavelength conversion unit may include a red fluorescent material, a green fluorescent material and a second encapsulating member configured to encapsulate the second light emitting device, the red fluorescent material, and the green fluorescent material.

The first encapsulating member may be formed of silicone and the mixing ratio of the blue fluorescent material to silicone may be 10% to 20%.

The controller may control the first driver so as to vary the level of the first supply current and control the second driver so as to fix the level of the second supply current, and thus shift the first chromaticity coordinates of light emitted from the first light source toward the second chromaticity coordinates of light emitted from the second light source on a 1931 CIE chromaticity diagram.

The controller may decrease the level of the first supply current to shift the first chromaticity coordinates to the second chromaticity coordinates.

The first chromaticity coordinates may be shifted linearly.

The first chromaticity coordinates may be shifted toward the second chromaticity coordinates within an ANSI-BIN region on the 1931 CIE chromaticity diagram.

The controller may control the first driver so as to vary the level of the first supply current from 0.16 A to 0.052 A and control the second driver so as to fix the level of the second supply current to 0.35 A.

The controller may control the first and second drivers so that the sum total of power consumed by the first and second light sources is changed from 1.140 W to 1.694 W.

The general chromaticity index (CRI: Ra) of light produced by mixing lights emitted from the first and second light sources may be 93 to 97. The correlated color temperature (CCT) of light produced by mixing lights emitted from the first and second light sources may be 2700K to 6500K.

The x-axis coordinate value and the y-axis coordinate value of the first chromaticity coordinates may be 0.1425 to 0.1825 and 0.1752 to 0.2152, respectively, and the x-axis coordinate value and the y-axis coordinate value of the second chromaticity coordinates may be 0.4768 to 0.5168 and 0.4461 to 0.4861.

The linearly shifted points of the first chromaticity coordinates may include at least one of $(1-1)^{th}$, $(1-2)^{th}$, $(1-3)^{th}$, $(1-4)^{th}$, or $(1-5)^{th}$ chromaticity coordinates (P1-1, P1-2, P1-3, P1-4, or P1-5), P1-1(Cx, Cy)=(0.3212, 0.3294),
P1-2(Cx, Cy)=(0.3271, 0.3340),
P1-3(Cx, Cy)=(0.3440, 0.3472),
P1-4(Cx, Cy)=(0.3796, 0.3749),
P1-5(Cx, Cy)=(0.4042, 0.3941).

Here, P1-i(Cx, Cy) ($1 \leq i \leq 5$) may represent an x-axis coordinate value (Cx) and a y-axis coordinate value (Cy) of $(1-i)^{th}$ chromaticity coordinates (P1-i).

The first chromaticity coordinates may be shifted on a line connecting the $(1-1)^{th}$ chromaticity coordinates and the $(1-5)^{th}$ chromaticity coordinates.

The blue fluorescent material may include at least one of BAM, nitride, or SiAlON, the red fluorescent material may include at least one of CASIN, nitride, or KSF, and the green fluorescent material may include at least one of silicate, nitride, or SiAlON.

The minimum values of the full widths at half maximum (FWHMs) of the blue, green and red fluorescent materials may be 45 nm.

The FWHMs of the blue, green and red fluorescent materials may be 70 nm to 90 nm.

BRIEF DESCRIPTION OF THE DRAWINGS

Arrangements and embodiments may be described in detail with reference to the following drawings in which like reference numerals refer to like elements and wherein.

DESCRIPTION OF SPECIFIC EMBODIMENTS

Hereinafter, exemplary embodiments to concretely realize the above objects will be described in detail with reference to the accompanying drawings.

In the following description of the embodiments, it will be understood that, when each element is referred to as being formed "on" or "under" the other element, it can be directly "on" or "under" the other element or be indirectly formed with one or more intervening elements therebetween.

In addition, it will also be understood that "on" or "under" one element may mean an upward direction and a downward direction of the element.

Further, relational terms "first", "second", "on/above/upper" and "under/below/lower" used in description of the embodiments do not necessarily require or imply physical or logical relations between substances and elements or order thereof but may be used only to distinguish one substance or element from other substances or elements.

Figure 1:
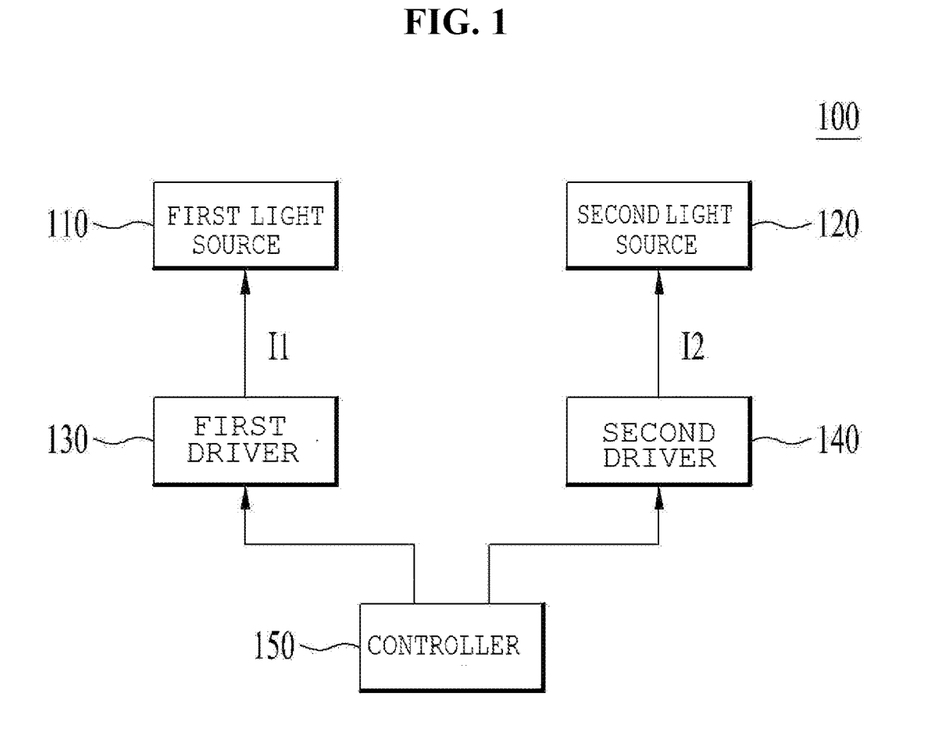
FIG. 1 is a conceptual block diagram of a lighting apparatus in accordance with one embodiment.

FIG. 1 is a conceptual block diagram of a lighting apparatus 100 in accordance with one embodiment.

The lighting apparatus 100 shown in FIG. 1 may include a light source unit including first and second light sources 110 and 120, a light source driving unit including first and second drivers 130 and 140 and a controller 150.

Here, the light source unit may include the first and second light sources 110 and 120 and the light source driving unit may include the first and second drivers 130 and 140, but embodiments are not limited thereto.

The first light source 110 emits light by first supply current I1 supplied from the first driver 130 and the second light source 120 emits light by second supply current I2 supplied from the second driver 140.

Figure 2A:
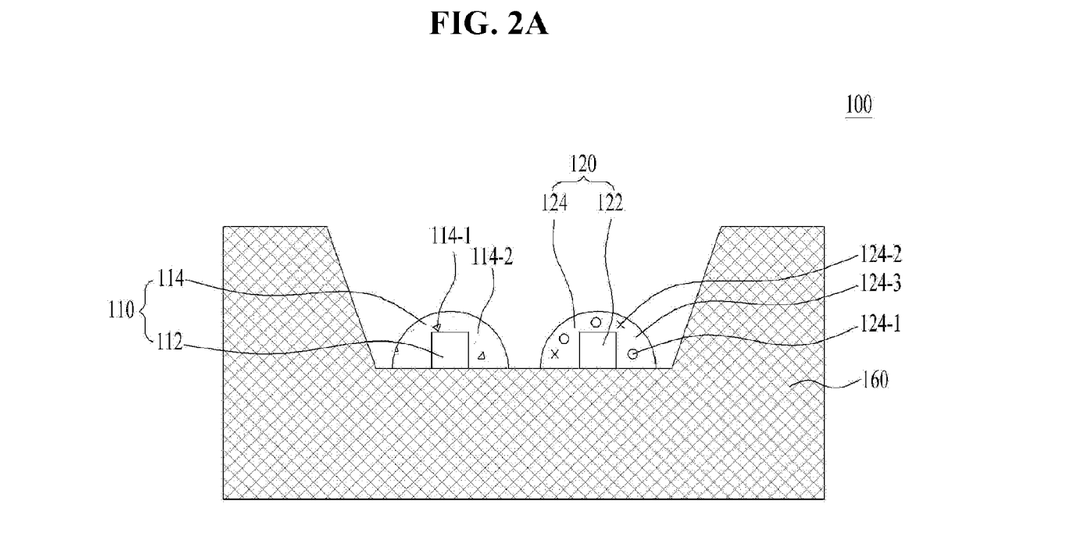
FIG. 2A is a cross-sectional view illustrating first and second light sources in the lighting apparatus in accordance with the embodiment shown in FIG. 1.
Figure 2B:
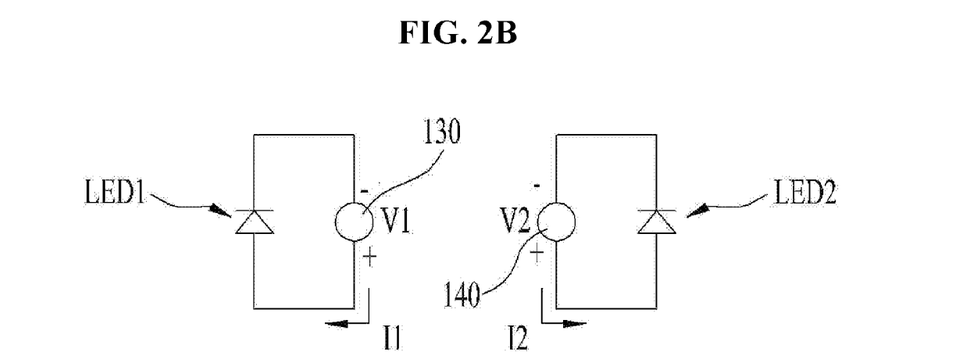
FIG. 2B is a circuit diagram of the lighting apparatus shown in FIG. 1.

FIG. 2A is a cross-sectional view illustrating the first and second light sources 110 and 120 in accordance with the embodiment in the lighting apparatus 100 shown in FIG. 1 and FIG. 2B is a circuit diagram of the lighting apparatus 100 shown in FIG. 1. LED1 and LED2 of FIG. 2B may correspond to the first and second light sources 110 and 120 shown in FIG. 1, respectively.

Although the lighting apparatus 100 shown in FIG. 1 will be described with reference to FIGS. 2A and 2B, embodiments are not limited to FIGS. 2A and 2B. That is, since FIGS. 2A and 2B illustrate only one example to describe the lighting apparatus 100 shown in FIG. 1, the lighting apparatus 100 in accordance with the embodiment is not limited to FIGS. 2A and 2B.

The first light source 110 may include a first light emitting device 112 and a first wavelength conversion unit 114. The first light emitting device 112 emits light by first supply current I1 supplied from the first driver 130. The first wavelength conversion unit 114 may convert the wavelength of light emitted from the first light emitting device 112 and emit light having the converted wavelength.

The first wavelength conversion unit 114 may include a blue fluorescent material 114-1 and a first encapsulating member 114-2. The first encapsulating member 114-2 may serve to encapsulate the first light emitting device 112 and the blue fluorescent material 114-1.

The second light source 120 may include a second light emitting device 122 and a second wavelength conversion unit 124. The second light emitting device 122 emits light by second supply current I2 supplied from the second driver 140. The second wavelength conversion unit 124 may convert the wavelength of light emitted from the second light emitting device 122 and emit light having the converted wavelength.

A package body 160 may include a cavity and the above-described first and second light emitting devices 112 and 122 may be disposed within the cavity on the package body 160 so as to be separated from each other. The package body 160 may include silicone, a synthetic resin, or metal. Although not shown, lead frames conductibly connected to the first and second light emitting devices 112 and 122 may be disposed on the package body 160.

At least one of the above-described first or second light emitting devices 112 or 122 may emit light of an ultraviolet (UV) wavelength band. Each of the first and second light emitting devices 112 and 122 may be an LED chip. Further, each of the first and second light emitting devices 112 and 122 may have a horizontal bonding structure, a vertical bonding structure or a flip-chip bonding structure and embodiments are not limited to these bonding structures.

In accordance with one embodiment, each of the first and second light emitting devices 112 and 122 may emit light of a UV wavelength band.

In accordance with another embodiment, the first light emitting device 112 may emit light of a UV wavelength band and the second light emitting device 122 may emit light of a blue wavelength band. The second wavelength conversion unit 124 may include a red fluorescent material 124-1, a green fluorescent material 124-2 and a second encapsulating material 124-3. The second encapsulating material 124-3 may serve to encapsulate the second light emitting device 122, the red fluorescent material 124-1 and the green fluorescent material 124-2.

In accordance with one embodiment, the blue fluorescent material may include at least one of $BaMgAl_{10}O_{17}:Eu^{2+}$ (BAM), nitride, or SiAlON, the red fluorescent material may include at least one of CASIN, nitride, or $KSF(K_2SiF_6)$ of the fluoride compound, and the green fluorescent material may include at least one of silicate, nitride, or SiAlON.

Further, the dominant wavelength (WD) of the blue fluorescent material is 450 nm to 490 nm, the dominant wavelength of the green fluorescent material is 570 nm to 590 nm and the dominant wavelength of the red fluorescent material is 610 nm to 660 nm, but embodiments are not limited thereto.

If UV light emitted from at least one of the first or second light sources 110 or 120 is combined with the blue fluorescent material, the red fluorescent material and the green fluorescent material, human eyes may recognize white light or light of color close to white.

Figure 3:
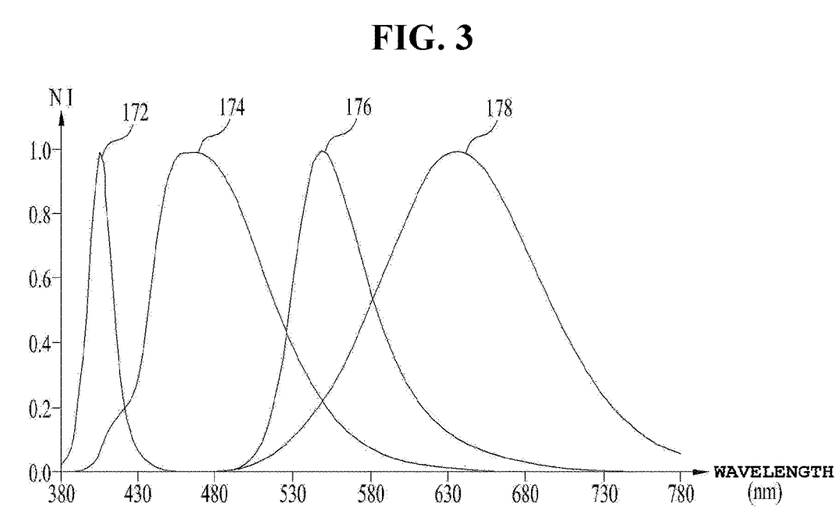
FIG. 3 is a graph describing full widths at half maximum (FWHMs) of fluorescent materials included in first and second wavelength conversion units.

FIG. 3 is a graph describing full widths at half maximum (FWHMs) of fluorescent materials included in the first and second wavelength conversion units 114 and 124, a horizontal axis represents wavelength and a vertical axis represents normalized intensity (NI).

In accordance with one embodiment, the minimum values of the FWHMs of the blue, green and red fluorescent materials may be 45 nm, but embodiments are not limited thereto. Otherwise, the FWHMs of the blue, green and red fluorescent materials may be 70 nm to 90 nm, but embodiments are not limited thereto. With reference to FIG. 3, it may be understood that the FWHM of a green fluorescent material 176 is greater than the FWHM of light 172 of a UV wavelength band emitted from at least one of the first or second light emitting devices 112 or 122, the FWHM of a blue fluorescent material 174 is greater than the FWHM of the green fluorescent material 176, and the FWHM of a red fluorescent material 178 is greater than the FWHM of the blue fluorescent material 174.

Further, the peak wavelength of the blue fluorescent material is 430 nm to 470 nm, the peak wavelength of the green fluorescent material is 510 nm to 560 nm and the peak wavelength of the red fluorescent material is 600 nm to 650 nm, but embodiments are not limited thereto.

The first or second encapsulating member 114 or 124 disposed on the light emitting device to emit light of the UV wavelength band out of the first and second light emitting devices 112 and 122 may further include a cyan fluorescent material (not shown). Further, the first or second encapsulating member 114 or 124 disposed on the light emitting device to emit light of the blue wavelength band out of the first and second light emitting devices 112 and 122 may further include at least one of an amber fluorescent material or a deep red fluorescent material. If these fluorescent materials are added, the general chromaticity index (CRI: Ra) may be higher.

The controller 150 serves to control the first and second drivers 130 and 140 of the light source driving unit. That is, under control of the controller 150, the first driver 130 may supply first supply current I1 to the first light source 110. Further, under control of the controller 150, the second driver 140 may supply second supply current I2 to the second light source 120.

The controller 150 may control the first driver 130 so as to vary the level of the first supply current I1 and control the second driver 140 so as to fix the level of the second supply current I2. If the first supply current I1 is varied, first chromaticity coordinates may be shifted to second chromaticity coordinates on a 1931 CIE chromaticity diagram. Here, the first chromaticity coordinates may mean chromaticity coordinates of light emitted from the first light source 110 and the second chromaticity coordinates may mean chromaticity coordinates of light emitted from the second light source 120.

Figure 4:
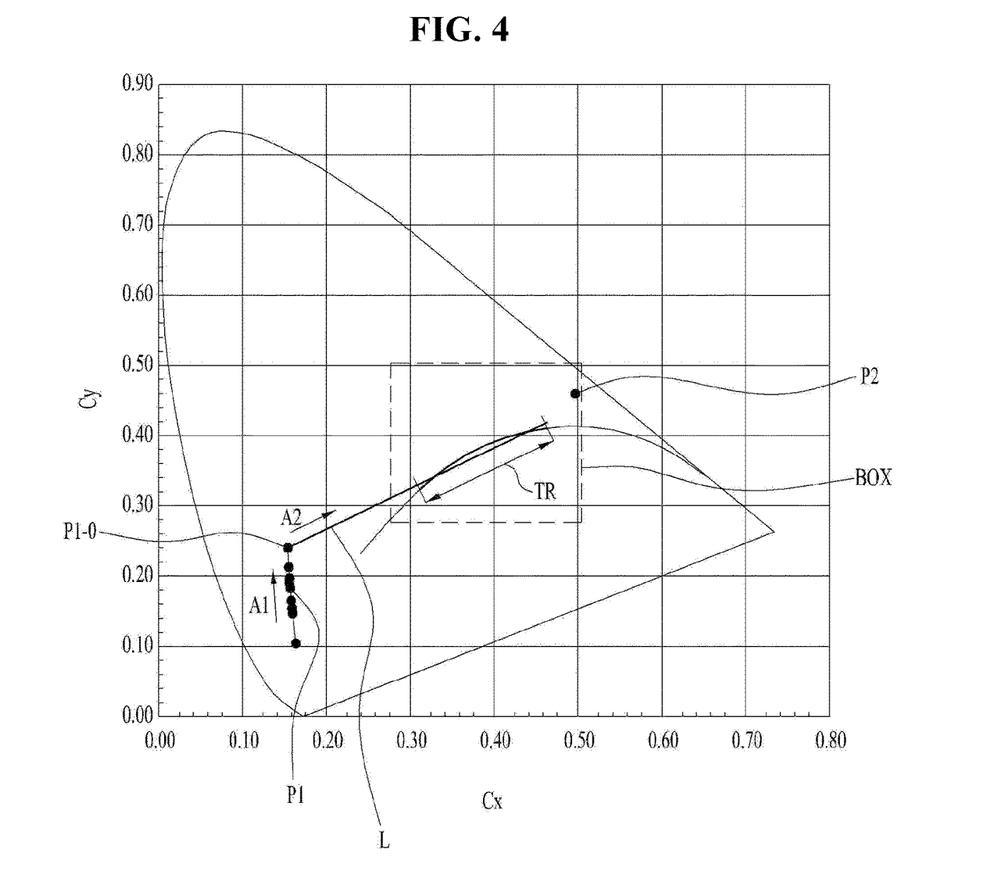
FIG. 4 is a view illustrating first and second chromaticity coordinates on a 1931 CIE chromaticity diagram.

FIG. 4 is a view illustrating first and second chromaticity coordinates on the 1931 CIE chromaticity diagram, a horizontal axis represents x-axis coordinate values (Cx) and a vertical axis represents y-axis coordinate values (Cy).

Figure 5:
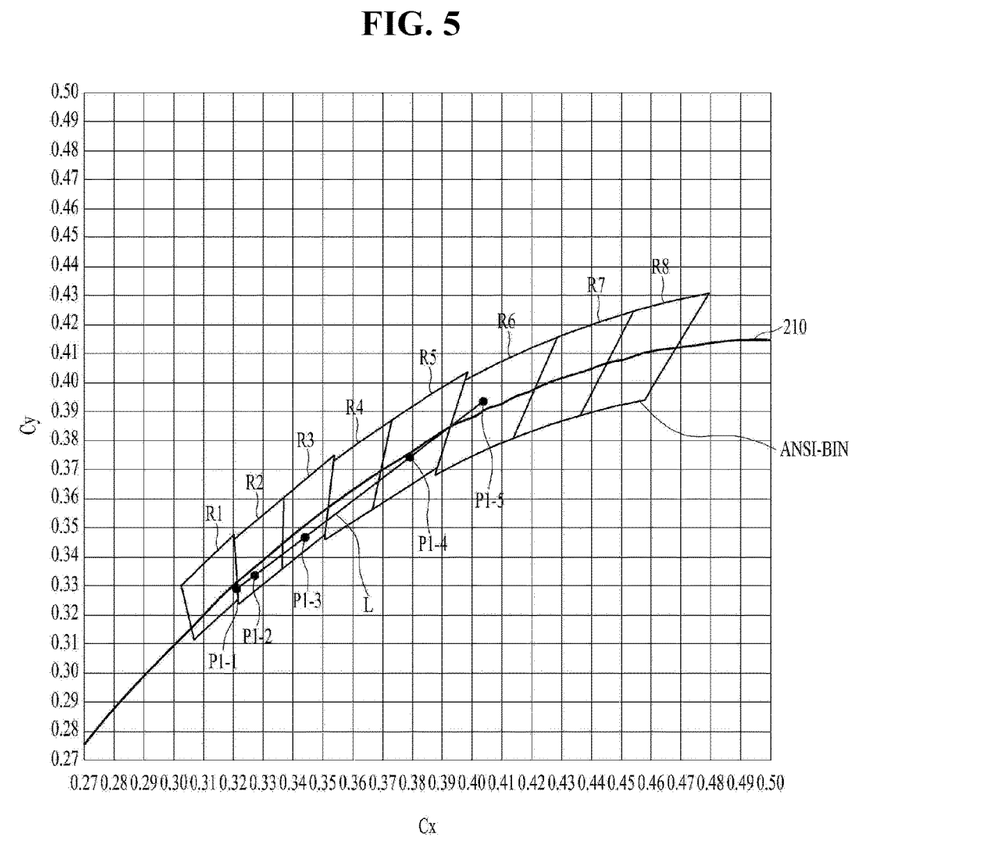
FIG. 5 is a an enlarged graph of a 'BOX' shown in FIG. 4.

FIG. 5 is an enlarged graph of a 'BOX' shown in FIG. 4.

With reference to FIGS. 4 and 5, on the CIE chromaticity diagram, if the first supply current I1 is decreased while the second supply current I2 is fixed, the first chromaticity coordinates may be shifted from a first point P1 to a $(1-0)^{th}$ point P1-0 in a direction of an arrow A1. Thereafter, when the first chromaticity coordinates are located at the $(1-0)^{th}$ point P1-0, if the second supply current I2 is continuously fixed and the first supply current I1 is continuously decreased, the first chromaticity coordinates may be shifted from the $(1-0)^{th}$ point P1-0 to a $(1-5)^{th}$ point P1-5 towards the second chromaticity coordinates P2.

Here, the first chromaticity coordinates may be linearly shifted from the $(1-0)^{th}$ point P1-0 to the $(1-5)^{th}$ point P1-5.

Hereinafter, the first chromaticity coordinates, the second chromaticity coordinates, the levels of the first and second supply currents I1 and I2, the levels of first and second supply voltages V1 and V2, the level of power, the general chromaticity index (CRI: Ra), the correlated color temperature (CCT), efficiency, and luminous flux will be described with reference to Table 1. Here, Table 1 states data acquired if the first and second light emitting devices 112 and 122 emit light of the UV wavelength band, the first wavelength conversion unit 114 includes the blue fluorescent material 114-1 and the second wavelength conversion unit 124 includes the red fluorescent material 124-1 and the green fluorescent material 124-2.

TABLE 1

| Division | First driver I1 (A) | First driver V1 (V) | Second driver I2 (A) | Second driver V2 (V) | Po (W) | Chromaticity coordinates Cx | Chromaticity coordinates Cy | Flux (lm) | CCT (K) | CRI Ra | Efficiency (lm/W) |
|---|---|---|---|---|---|---|---|---|---|---|---|
| LED1 | 0.350 | 3.258 | 0.350 | 3.372 | 1.140 | 0.1625 | 0.1952 | 71.9 | — | — | — |
| LED2 | | | | | 1.180 | 0.4968 | 0.4661 | 84.5 | — | — | — |
| 6000 K | 0.160 | 3.209 | | | 1.694 | 0.3212 | 0.3294 | 123.2 | 6052 K | 94 | 72.7 |
| 5700 K | 0.150 | 3.199 | | | 1.660 | 0.3271 | 0.3340 | 120.6 | 5749 K | 94 | 72.7 |
| 5000 K | 0.120 | 3.161 | | | 1.560 | 0.3440 | 0.3472 | 114.1 | 5026 K | 96 | 73.1 |
| 4000 K | 0.075 | 3.093 | | | 1.412 | 0.3796 | 0.3749 | 103.6 | 4010 K | 97 | 73.3 |
| 3500 K | 0.052 | 3.052 | | | 1.339 | 0.4042 | 0.3941 | 98.1 | 3552 K | 93 | 73.3 |

Here, LEDs and LED2 respectively represent the first and second light sources 110 and 120.

In Table 1, the x-axis coordinate value (Cx) and the y-axis-coordinate value (Cy) of the first chromaticity coordinates P1 and the x-axis coordinate value (Cx) and the y-axis-coordinate value (Cy) of the second chromaticity coordinates P2 may be shifted by ±0.02 based on the corresponding coordinates. For example, the x-axis coordinate value (Cx) of the first chromaticity coordinates P1 may be 0.1425 to 0.1825 and the y-axis coordinate value (Cy) of the first chromaticity coordinates P1 may be 0.1752 to 0.2152. Further, the x-axis coordinate value (Cx) of the second chromaticity coordinates P2 may be 0.4768 to 0.5168 and the y-axis coordinate value (Cy) of the second chromaticity coordinates P2 may be 0.4461 to 0.4861.

With reference to Table 1, the controller 150 controls the first and second drivers 130 and 140 so as to supply first and second supply currents I1 and I2 of 0.35 A. In this case, the first light source 110 emits light having first chromaticity coordinates of the first point P1 having an x-axis coordinate value (Cx) of 0.1625 and a y-axis coordinate value (Cy) of 0.1952 on the 1931 CIE chromaticity diagram, and the second light source 120 emits light having second chromaticity coordinates of the second point P2 having an x-axis coordinate value (Cx) of 0.4968 and a y-axis coordinate value (Cy) of 0.4661 on the 1931 CIE chromaticity diagram.

Thereafter, the controller 150 controls the first driver 130 so as to vary the first supply current I1 from 0.160 A to 0.052 A and controls the second driver 140 so as to fix the second supply current I2 to 0.35 A. According to decrease of the first supply current I1, the first chromaticity coordinates P1 may be linearly shifted toward the second chromaticity coordinates P2 on a line L connecting the point $(1\text{-}1)^{th}$ P1-1 and the $(1\text{-}5)^{th}$ point P1-5. The shifted points of the first chromaticity coordinates may include at least one of the $(1\text{-}1)^{th}$ point P1-1, the $(1\text{-}2)^{th}$ point P1-2, the $(1\text{-}3)^{th}$ point P1-3, the $(1\text{-}4)^{th}$ point P1-4, or the $(1\text{-}5)^{th}$ point P1-5.

The coordinates of the $(1\text{-}1)^{th}$ to $(1\text{-}5)^{th}$ points P1-1 to P1-5 are stated in Table 1 above and may be also expressed below, but embodiments are not limited thereto.

P1-1(Cx, Cy)=(0.3212, 0.3294),
P1-2(Cx, Cy)=(0.3271, 0.3340),
P1-3(Cx, Cy)=(0.3440, 0.3472),
P1-4(Cx, Cy)=(0.3796, 0.3749), and
P1-5(Cx, Cy)=(0.4042, 0.3941)

Here, P1-i(Cx, Cy) represents an x-axis coordinate value (Cx) and a y-axis coordinate value (Cy) of $(1\text{-}i)^{th}$ chromaticity coordinates and $1 \leq i \leq 5$.

With reference to Table 1, when the first supply current I1 of 0.16 A and the second supply current I2 fixed to 0.350 A are supplied under control of the controller 150, the first light source 110 emits light having first chromaticity coordinates of the $(1\text{-}1)^{th}$ point P1-1 having an x-axis coordinate value (Cx) of 0.3212 and a y-axis coordinate value (Cy) of 0.3294.

Here, if the first supply current is varied from 0.16 A to 0.15 A while the second supply current I2 is fixed to 0.350 A, the first chromaticity coordinates of light emitted from the first light source 110 are shifted to the $(1\text{-}2)^{th}$ point P1-2 having an x-axis coordinate value (Cx) of 0.3271 and a y-axis coordinate value (Cy) of 0.3340.

Here, if the first supply current is varied from 0.15 A to 0.12 A while the second supply current I2 fixed to 0.350 A, the first chromaticity coordinates of light emitted from the first light source 110 are shifted to the $(1\text{-}3)^{th}$ point P1-3 having an x-axis coordinate value (Cx) of 0.3440 and a y-axis coordinate value (Cy) of 0.3472.

Further, if the first supply current is varied from 0.12 A to 0.075 A while the second supply current I2 fixed to 0.350 A, the first chromaticity coordinates of light emitted from the first light source 110 are shifted to the $(1\text{-}4)^{th}$ point P1-4 having an x-axis coordinate value (Cx) of 0.3796 and a y-axis coordinate value (Cy) of 0.3749.

Further, if the first supply current is varied from 0.075 A to 0.052 A while the second supply current I2 fixed to 0.350 A, the first chromaticity coordinates of light emitted from the first light source 110 are shifted to the $(1\text{-}5)^{th}$ point P1-5 having an x-axis coordinate value (Cx) of 0.4042 and a y-axis coordinate value (Cy) of 0.3941.

It may be understood that, when the first supply current I1 is decreased under the condition that the second supply current I2 is fixed, as described above, the first chromaticity coordinates are linearly shifted toward the second chromaticity coordinates.

Here, the sum total of power Po consumed by the first and second light sources 110 and 120 respectively receiving the first and second supply currents I1 and I2 output from the first and second drivers 130 and 140 under control of the controller 150 may be changed from 1.140 W to 1.694 W, as stated in Table 1.

With reference to Table 1, the controller 150 may control the first and second drivers 130 and 140 so that the general CRI (Ra) of light produced by mixing lights emitted from the first and second light sources 110 and 120 respectively receiving the first and second supply currents I1 and I2 may be tuned from 93 to 97. It may be understood that, by varying the first supply current I1 under the fixed state of the second supply current I2, the general CRI (Ra) of the lighting apparatus may be tuned.

Further, the lighting apparatus 100 in accordance with one embodiment has a high general CRI (Ra) of up to 97, which is similar to that of sunlight, as known from Table 1. The reason why the lighting apparatus 100 in accordance with one embodiment has a high general CRI (Ra) is that at least one of the first or second light sources 110 or 120 emits light of a UV wavelength band having a wide FWHM. If the first and second light sources 110 and 120 do not emit light of a UV wavelength band but emit light of a blue wavelength band, light of a wavelength band having a peak wavelength of 450 nm or less may not be emitted. However, if at least one of the first or second light sources 110 or 120 emits light of a UV wavelength band, color within the range of 380 nm to 430 nm centering on the peak wavelength of 405 nm may be produced.

For this reason, the lighting apparatus 100 in accordance with one embodiment may have a high general CRI (Ra).

Figure 6A:
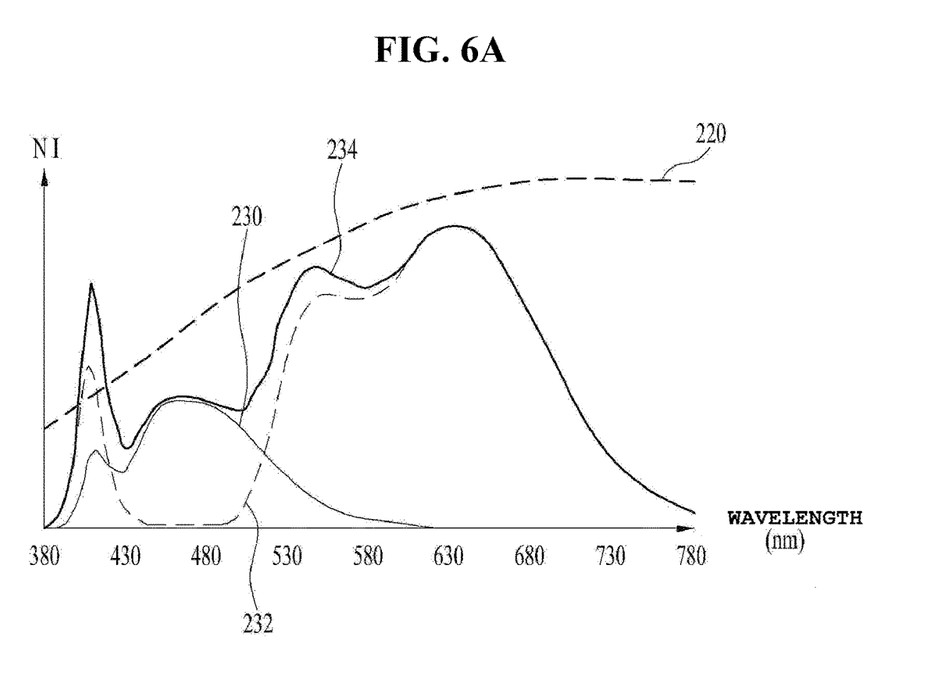
FIGS. 6A and 6B are graphs describing general CRIs of spectrums at CCTs.
Figure 6B:
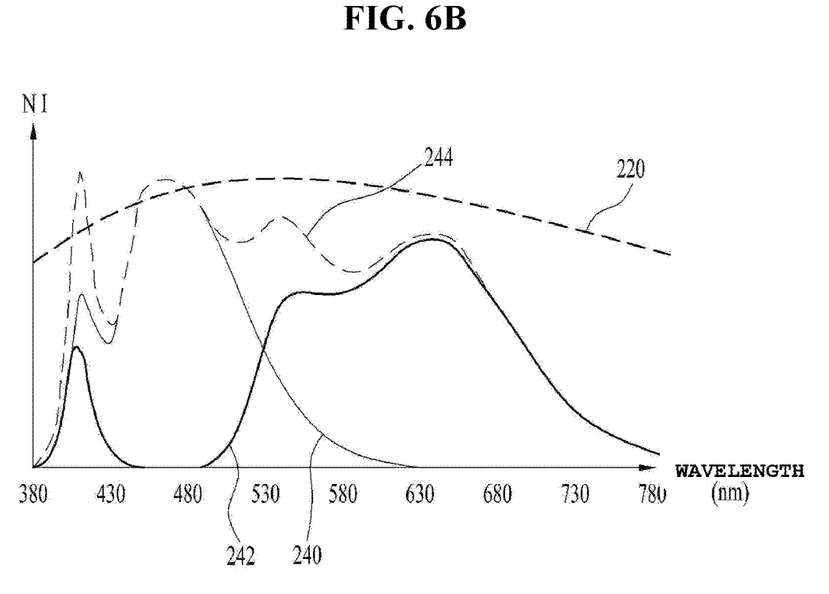

FIGS. 6A and 6B are graphs describing general CRIs of spectrums at CCTs, a horizontal axis represents wavelength and a vertical axis represents normalized intensity (NI).

It is assumed that both the first and second light sources 112 and 122 emit light of a UV wavelength band, the first wavelength conversion unit 114 includes the blue fluorescent material 114-1, and the second wavelength conversion unit 124 includes the red fluorescent material 124-1 and the green fluorescent material 124-2. In this case, with reference to Table 1 and FIG. 6A, it may be understood that, when a CCT is 4000K, the general CRI (Ra) of light 234 produced by mixing light 230 emitted from the first light source 110 and light 232 emitted from the second light source 120 is 97 based on a black body curve 220. Or, with reference to FIG. 6B, it may be understood that, when a CCT is 6000K, the general CRI (Ra) of light 244 produced by mixing light 240 emitted from the first light source 110 and light 242 emitted from the second light source 120 is 94 based on the black body curve 220.

Further, the CCT of light produced by mixing lights emitted from the first and second light sources 110 and 120 respectively receiving the first and second supply currents I1 and I2 output from the first and second drivers 130 and 140 under control of the controller 150 may be tuned from 2700K to 6500K. That is, it may be understood that, by varying the first supply current I1 under the fixed state of the second supply current I2, the CCT of the lighting apparatus 100 may be tuned within a temperature range TR shown in FIG. 4.

Further, with reference to Table 1, the CCTs at the $(1-1)^{th}$, $(1-2)^{th}$, $(1-3)^{th}$, $(1-4)^{th}$, and $(1-5)^{th}$ chromaticity coordinates P1-1, P1-2, P1-3, P1-4 and P1-5 may be 6052K, 5749K, 5026K, 4010K, and 3552K, respectively, but embodiments are not limited thereto.

Further, the lighting apparatus 100 in accordance with one embodiment may use just two light sources and reduce the number of drivers, thus reducing costs.

Further, the lighting apparatus in accordance with one embodiment may have high efficiency of 70 lm/W or higher, as exemplarily stated in Table 1.

Further, FIG. 5 illustrates the 1931 CIE chromaticity diagram in detail when each of the x-axis coordinate value (Cx) and the y-axis coordinate value (Cy) of chromaticity coordinates is within the range of 0.27 to 0.5. In FIG. 5, a line 210 is a Planckian black-body radiation white curve at different temperatures. These temperatures are known as CCTs. Eight regions R1 to R8 represent CCT regions of an so-called "ANSI binning system". The ANSI binning system classifies white CCTs into 8 levels. That is, the first region R1 corresponds to cold-white light, i.e., 6500K, the second region R2 corresponds to 5700K regarded as cold-white light, the third region R3 corresponds to 5000K regarded as neutral-white light, the fourth region R4 corresponds to 4500K, the fifth region R5 corresponds to 4000K, the sixth region R6 corresponds to 3500K, the seventh region R7 corresponds to 3000K, and the eighth region R8 corresponds to 2700K. The fourth to eighth regions R4 to R8 may be regarded as warm-white light.

With reference to FIG. 5, the first chromaticity coordinates P1-1, P1-2, P1-3, P1-4 and P1-5 may be shifted toward the second chromaticity coordinates P2 within the ANSI-BIN region on the 1931 CIE chromaticity diagram. That is, the line L connecting the $(1-1)^{th}$ chromaticity coordinates P1-1 and the $(1-5)^{th}$ chromaticity coordinates P1-5 may be located within the ANSI-BIN region. If the first chromaticity coordinates are shifted within the ANSI-BIN region, light produced by mixing lights emitted from the first and second light sources 110 and 120 may be white light.

If the above-described first light emitting device 112 emits light of a UV wavelength band and the first encapsulating member 114 is formed of silicone, the usage rate of UV light emitted from the first light emitting device 112 in the blue fluorescent material 114-1 and the conversion efficiency of the UV light may be influenced by the mixing ratio of the blue fluorescent material 114-1 to silicone.

Figure 7:
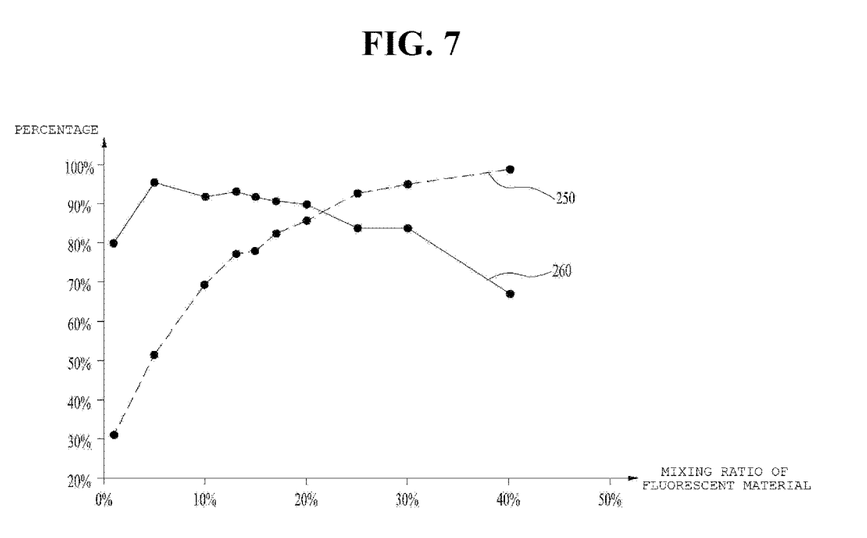
FIG. 7 is a graph representing usage rates and conversion efficiencies of UV light according to mixing ratios of a blue fluorescent material encapsulated by a first encapsulating member shown in FIG. 2A.

FIG. 7 is a graph representing usage rates and conversion efficiencies of UV light according to mixing ratios of the blue fluorescent material 114-1 encapsulated by the first encapsulating member 114 shown in FIG. 2A, a horizontal axis represents the mixing ratio of the fluorescent material and a vertical axis represents percentage.

Table 2 states usage rates 250 and conversion efficiencies 260 of light emitted from the first light emitting device 112 according to mixing ratios of the blue fluorescent material 114-1 to silicone.

TABLE 2

| Mixing ratio (%) | Usage rate (%) of UV light | Light conversion efficiency (%) |
|---|---|---|
| 1 | 31 | 81 |
| 5 | 52 | 96 |
| 10 | 70 | 92 |
| 13 | 78 | 93 |
| 15 | 79 | 92 |
| 17 | 83 | 91 |
| 20 | 86 | 90 |
| 25 | 93 | 84 |
| 30 | 96 | 84 |
| 40 | 100 | 68 |

With reference to FIG. 7 and Table 2, it may be understood that, when the blue fluorescent material 114-1 is mixed with silicone at a specific ratio, light excited from the first light emitting device 112 is emitted with high efficiency. That is, if the blue fluorescent material 114-1 is mixed with silicone at a low ratio, for example, 0 to 10%, the reception rate of the UV light emitted from the first light emitting device 112 by the blue fluorescent material 114-1 is low, i.e., 70% or lower. However, if the blue fluorescent material 114-1 is mixed with silicone at a ratio of higher than 10%, the reception rate of the UV light emitted from the first light emitting device 112 by the blue fluorescent material 114-1 is increased and light conversion efficiency is increased. However, when the mixing ratio of the blue fluorescent material 114-1 with silicone is 15% or less, light conversion efficiency may be continuously decreased.

The reception rate 250 of the UV light by the blue fluorescent material 114-1 and the light conversion efficiency 260 are both preferably higher. For example, the mixing ratio of the blue fluorescent material 114-1 with silicone may be 10% to 40%, for example, 10% to 20%, but embodiments are not limited thereto.

As described above, at least one of the general CRI (Ra) or the CCT may be tuned if light produced by mixing lights emitted from the first and second light sources 110 and 120 of the lighting apparatus 100 in accordance with one embodiment is white light, but embodiments are not limited thereto. That is, the lighting apparatus 100 in accordance with one embodiment may be applied to the case in that light produced by mixing lights emitted from the first and second light sources 110 and 120 is light other than white light.

Figure 8:
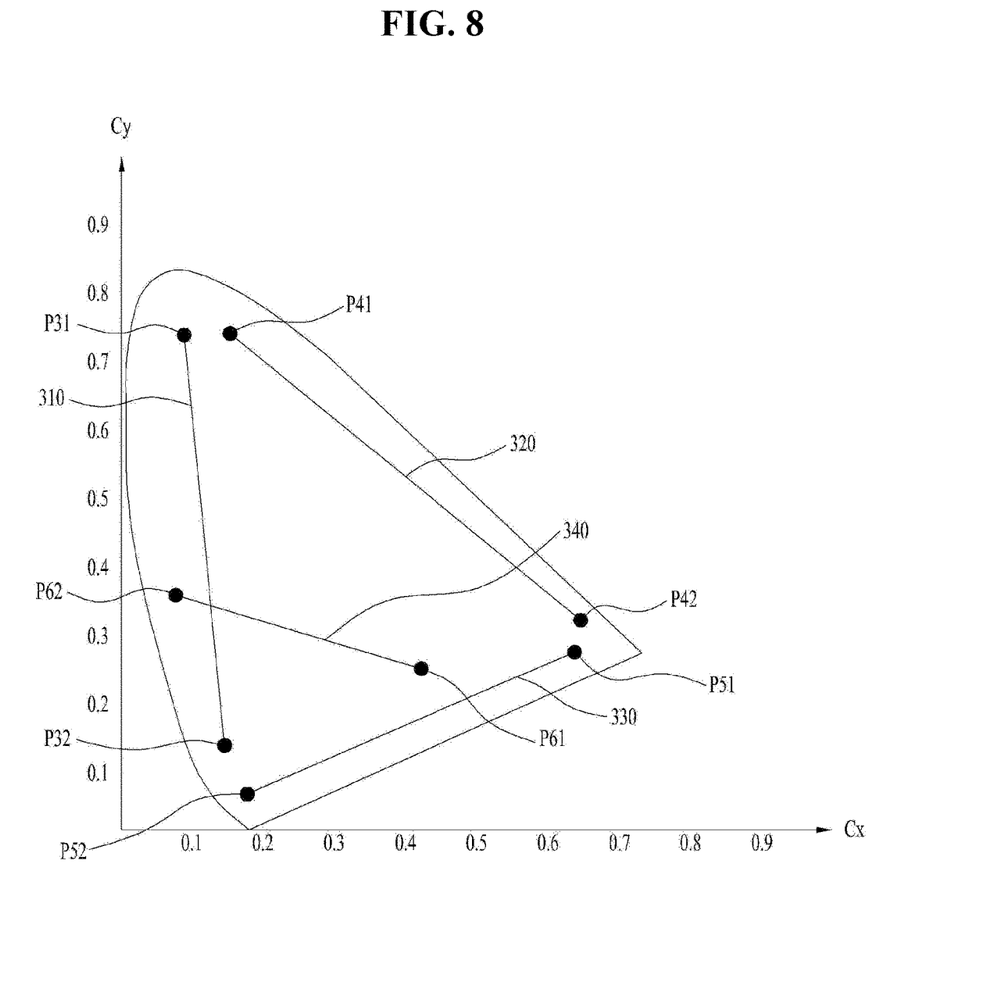
FIG. 8 is a view illustrating the 1931 CIE chromaticity diagram to describe chromaticity coordinates of light emitted from the lighting apparatus in accordance with the embodiment shown in FIG. 1.

FIG. 8 is a view illustrating the 1931 CIE chromaticity diagram to describe chromaticity coordinates of light emitted from the lighting apparatus 100 in accordance with the embodiment shown in FIG. 1.

In accordance with another embodiment, the first and second light sources 110 and 120 shown in FIG. 1 may respectively emit blue light and green light. In this case, if the controller 150 controls the first and second drivers 130 and 140 so as to vary first supply current I1 and to fix second supply current I2, the first chromaticity coordinates may be shifted from a $(3-1)^{th}$ point P31 toward the second chromaticity coordinates at a $(3-2)^{th}$ point P32. Further, the first chromaticity coordinates may be shifted from the $(3-2)^{th}$ point P32 toward the second chromaticity coordinates at the $(3-1)^{th}$ point P31. That is, light having the first chromaticity coordinates at any point on a line 310 connecting the $(3-1)^{th}$ point P31 and the $(3-2)^{th}$ point P32 may be emitted from the first light source 110. Therefore, a color sense of a bluish green color may be finely changed on the line 320 by varying the first supply current I1.

In accordance with still another embodiment, the first and second light sources 110 and 120 shown in FIG. 1 may respectively emit green light and red light. In this case, if the controller 150 controls the first and second drivers 130 and 140 so as to vary first supply current I1 and to fix second supply current I2, the first chromaticity coordinates may be shifted from a $(4-1)^{th}$ point P41 toward the second chromaticity coordinates at a $(4-2)^{th}$ point P42. Further, the first chromaticity coordinates may be shifted from the $(4-2)^{th}$ point P42 toward the second chromaticity coordinates at the $(4-1)^{th}$ point P41. As described above, light having the first chromaticity coordinates at any point on a line 320 connecting the $(4-1)^{th}$ point P41 and the $(4-2)^{th}$ point P42 may be emitted from the first light source 110. Therefore, color sense of yellow and orange may be finely changed on the line 320 by varying the first supply current I1.

In accordance with still another embodiment, the first and second light sources 110 and 120 shown in FIG. 1 may respectively emit blue light and red light. In this case, if the controller 150 controls the first and second drivers 130 and 140 so as to vary first supply current I1 and to fix second supply current I2, the first chromaticity coordinates may be shifted from a $(5-1)^{th}$ point P51 toward the second chromaticity coordinates at a $(5-2)^{th}$ point P52. Further, the first chromaticity coordinates may be shifted from the $(5-2)^{th}$ point P52 toward the second chromaticity coordinates at the $(5-1)^{th}$ point P51. As described above, light having the first chromaticity coordinates at any point on a line 330 connecting the $(5-1)^{th}$ point P51 and the $(5-2)^{th}$ point P52 may be emitted from the first light source 110. Therefore, a color sense of pink color may be finely changed on the line 330 by varying the first supply current I1.

In accordance with yet another embodiment, the first and second light sources 110 and 120 shown in FIG. 1 may respectively emit bluish green light and pink light. In this case, if the controller 150 controls the first and second drivers 130 and 140 so as to vary first supply current I1 and to fix second supply current I2, the first chromaticity coordinates may be shifted from a $(6-1)^{th}$ point P61 toward the second chromaticity coordinates at a $(6-2)^{th}$ point P62. Or, the first chromaticity coordinates may be shifted from the $(6-2)^{th}$ point P62 toward the second chromaticity coordinates at the $(6-1)^{th}$ point P61. As described above, light having the first chromaticity coordinates at any point on a line 340 connecting the $(6-1)^{th}$ point P61 and the $(6-2)^{th}$ point P62 may be emitted from the first light source 110. Therefore, a color sense of pastel color may be finely changed on the line 340 by varying the first supply current I1.

The lighting apparatus 100 in accordance with the above-described embodiment may be applied to various fields, such as emotional illumination and medicine. Particularly, the lighting apparatus 100, in which at least one optical property of a general CRI (Ra) or a CCT may be tuned, may be usefully applied to mood lighting or decorative lighting so as to create an emotional atmosphere. For example, the lighting apparatus 100, in which optical properties may be tuned, may be usefully applied to modify lighting conditions of tables or various display cases in a restaurant, a bar, a hotel, and a shopping center.

As apparent from the above description, not only a lighting apparatus in accordance with one embodiment may tune at least one optical property out of a general CRI (Ra) or a CCT but also at least one of two light sources in the lighting apparatus in accordance with one embodiment emits light of a UV wavelength band so that FWHM becomes wide. Thereby, the lighting apparatus in accordance with one embodiment has a high general CRI (Ra) of 93 or more, reduces the number of current drivers due to use of only two light sources to tune the optical property, and thus has a simple structure and reduces costs, and has high efficiency of 70 lm/W or more.

Although embodiments have been described with reference to a number of illustrative embodiments thereof, it should be understood that numerous other modifications and embodiments can be devised by those skilled in the art that will fall within the spirit and scope of the principles of this disclosure. More particularly, various variations and modifications are possible in the component parts and/or arrangements of the subject combination arrangement within the scope of the disclosure, the drawings and the appended claims. In addition to variations and modifications in the component parts and/or arrangements, alternative uses will also be apparent to those skilled in the art.

What is claimed is:
1. A lighting apparatus, comprising:
 a light source unit including a first light source and a second light source;
 a light source driving unit including a first driver configured to supply first supply current to the first light source and a second driver configured to supply second supply current to the second light source; and
 a controller configured to control the first driver so as to vary the level of the first supply current and to control the second driver so as to fix the level of the second supply current, and thus shifts first chromaticity coordinates of the light emitted from the first light source toward second chromaticity coordinates of the light emitted from the second light source on a 1931 CIE chromaticity diagram,
 wherein the first chromaticity coordinates are shifted toward the second chromaticity coordinates within an ANSI-BIN region on the 1931 CIE chromaticity diagram, wherein the first light source includes:
a first light emitting device emitting light of a UV wavelength band; and
a first wavelength conversion unit configured to convert the wavelength of the light emitted from the first light emitting device,
wherein the second light source includes:
a second light emitting device emitting light of a blue wavelength band; and
a second wavelength conversion unit configured to convert the wavelength of the light emitted from the second light emitting device,
wherein the first wavelength conversion unit includes:
a blue fluorescent material; and
a first encapsulating member configured to encapsulate the first light emitting device and the blue fluorescent material,
wherein the second wavelength conversion unit includes:
a red fluorescent material;
a green fluorescent material, and
a second encapsulating member configured to encapsulate the second light emitting device, the red fluorescent material, and the green fluorescent material, and
wherein full widths at half maximum (FWHMs) of the blue, green and red fluorescent materials are 70 nm to 90 nm.

2. The lighting apparatus according to claim 1, wherein the controller decreases the level of the first supply current to shift the first chromaticity coordinates to the second chromaticity coordinates.

3. The lighting apparatus according to claim 1, wherein the first chromaticity coordinates are shifted linearly.

4. The lighting apparatus according to claim 1, wherein the controller controls the first driver so as to vary the level of the first supply current from 0.16 A to 0.052 A and controls the second driver so as to fix the level of the second supply current to 0.35 A.

5. The lighting apparatus according to claim 4, wherein the controller controls the first and second drivers so that the sum total of power consumed by the first and second light sources is changed from 1.140 W to 1.694 W.

6. The lighting apparatus according to claim 1, wherein the general chromaticity index (CRI: Ra) of light produced by mixing lights emitted from the first and second light sources is 93 to 97.

7. The lighting apparatus according to claim 1, wherein the correlated color temperature (CCT) of light produced by mixing lights emitted from the first and second light sources is 2700K to 6500K.

8. The lighting apparatus according to claim 1, wherein the x-axis coordinate value and the y-axis coordinate value of the first chromaticity coordinates are 0.1425 to 0.1825 and 0.1752 to 0.2152, respectively and the x-axis coordinate value and the y-axis coordinate value of the second chromaticity coordinates are 0.4768 to 0.5168 and 0.4461 to 0.4861, respectively.

9. The lighting apparatus according to claim 3, wherein the linearly shifted points of the first chromaticity coordinates include at least one of $(1-1)^{th}$, $(1-2)^{th}$, $(1-3)^{th}$, $(1-4)^{th}$, or $(1-5)^{th}$ chromaticity coordinates (P1-1, P1-2, P1-3, P1-4, or P1-5), wherein:
P1-1(Cx, Cy)=(0.3212, 0.3294);
P1-2(Cx, Cy)=(0.3271, 0.3340);
P1-3(Cx, Cy)=(0.3440, 0.3472);
P1-4(Cx, Cy)=(0.3796, 0.3749);
P1-5(Cx, Cy)=(0.4042, 0.3941),
(wherein P1-i(Cx, Cy) ($1 \leq i \leq 5$) represents an x-axis coordinate value (Cx) and a y-axis coordinate value (Cy) of $(1-i)^{th}$ chromaticity coordinates (P1-i)).

10. The lighting apparatus according to claim 9, wherein the first chromaticity coordinates are shifted on a line connecting the $(1-1)^{th}$ chromaticity coordinates and the $(1-5)^{th}$ chromaticity coordinates.

11. The lighting apparatus according to claim 1, wherein:
the blue fluorescent material includes at least one of BAM, nitride, or SiAlON;
the red fluorescent material includes at least one of CASIN, nitride, or KSF; and
the green fluorescent material includes at least one of silicate, nitride, or SiAlON.

12. The lighting apparatus according to claim 1, wherein:
the first encapsulating member is formed of silicone; and
a mixing ratio of the blue fluorescent material to silicone is 10% to 20%.

* * * * *